United States Patent
Zhang

(10) Patent No.: US 10,511,098 B2
(45) Date of Patent: Dec. 17, 2019

(54) ANTENNAS

(71) Applicant: Yi Zhang, Beijing (CN)

(72) Inventor: Yi Zhang, Beijing (CN)

(*) Notice: Subject to any disclaimer, the term of this patent is extended or adjusted under 35 U.S.C. 154(b) by 24 days.

(21) Appl. No.: 15/697,337

(22) Filed: Sep. 6, 2017

(65) Prior Publication Data

US 2018/0294572 A1    Oct. 11, 2018

(30) Foreign Application Priority Data

Apr. 11, 2017 (CN) .......................... 2017 1 0233627
Aug. 14, 2017 (CN) .......................... 2017 1 0691685

(51) Int. Cl.
*H01Q 9/22* (2006.01)
*H01Q 1/42* (2006.01)
*H03H 7/38* (2006.01)
*H01Q 13/20* (2006.01)

(52) U.S. Cl.
CPC .............. *H01Q 9/22* (2013.01); *H01Q 1/42* (2013.01); *H01Q 1/422* (2013.01); *H01Q 13/206* (2013.01); *H03H 7/38* (2013.01); *H03H 2007/386* (2013.01)

(58) Field of Classification Search
CPC ............ H01Q 9/22; H01Q 1/42; H01Q 1/422; H01Q 13/206; H03H 7/38

USPC .......................................................... 343/791
See application file for complete search history.

(56) References Cited

U.S. PATENT DOCUMENTS

| | | | | |
|---|---|---|---|---|
| 5,617,105 A | * | 4/1997 | Tsunekawa | H01Q 1/24 343/702 |
| 6,483,471 B1 | * | 11/2002 | Petros | H01Q 9/16 343/725 |
| 6,552,692 B1 | * | 4/2003 | Zeilinger | H01Q 9/16 343/791 |
| 7,064,728 B1 | * | 6/2006 | Lin | H01Q 1/242 343/790 |

* cited by examiner

*Primary Examiner* — Hai V Tran
(74) *Attorney, Agent, or Firm* — Knobbe, Martens, Olson & Bear, LLP

(57) ABSTRACT

An antenna includes a metal tube, a coaxial cable disposed along a central axis of the metal tube, and a variable-impedance transmission wire structure. A dielectric body and a metal part are arranged along an axial direction of the cable. The antenna makes the resulting structure stable and reliable, achieves miniaturization of a multi-band antenna and provides a sufficiently wide bandwidth for each frequency band. The antenna also realizes easy control of the radiation pattern and is convenient for practical applications.

19 Claims, 3 Drawing Sheets

ANTENNAS

TECHNICAL FIELD

The present disclosure relates to the field of wireless signal technology, and particularly to antennas.

BACKGROUND

It is well known that an antenna is a device for mutual transformation between guided waves in transmission wires and electromagnetic waves in space, and serves as an essential component in a wireless unit.

In a case that there is not any determined positional (azimuth, distance, height) relationship between wireless communication devices, an ideal radiation pattern is generally required to be omni-directional in the horizontal plane and be similar to a half-wave dipole in the vertical plane.

As the wireless communication technology develops, more and more frequency bands are required to be supported by antennas, which brings significant challenges in antenna design. According to the antenna theory, an effective length of a radiator should be comparable to ¼ wavelength to achieve higher efficiency. Comprehensively considering of multiple aspects including volume, weight, cost, portability, aesthetic measure and the like, as an ideal external omni-directional antenna for a wireless communication device, its length-diameter ratio (or length-width ratio) should be greater than 6, and a structure of the antenna is preferable to be axisymmetric to maintain a good roundness for the radiation pattern in the horizontal plane. If a planar structure is adopted, a maximum width of the radiator should be less than ⅛ of a wavelength of the highest operating frequency, so as to maintain a non-roundness of the radiation pattern in the horizontal plane within 3 dB.

It is with superior performance for a coaxial half-wave dipole antenna with excellent roundness in the horizontal plane as well as high radiation efficiency under good impedance matching. However, a standard coaxial half-wave dipole antenna is of a single frequency, and has a bandwidth typically no more than 10% when its Voltage Standing Wave Ratio (VSWR) is less than 2. Existing methods for spreading a bandwidth of an external antenna include:

1. Disposing multiple radiating elements, so that there will be multiple resonance paths for current;
2. Disposing a parasitic radiating element so as to spread the bandwidth utilizing coupling between a main radiating element and the parasitic radiating element.
3. Thickening and widening the radiating element;
4. Disposing a sleeve over the antenna to enable the antenna to resonate in a high frequency band.

However, the methods mentioned above are limited in being applied to a small-sized antenna. For example, they are severely restricted by a radial/lateral size of the antenna. Specifically, in the first method, there are certain distances between radiating elements respectively, thereby being not covering full frequency bands due to being limited by space to not provide enough radiating elements. The second and fourth methods can spread a single band antenna to a dual-band or multi-band antenna, but a bandwidth for each frequency band will be not wide enough and a bandwidth of the VSWR for each frequency band is not ideal, and furthermore, distances are non-optimal from main radiating elements to parasitic radiating element and the sleeve. The third method requires to largely thicken the radiating element, which makes it difficult to be applied to small-sized antennas.

SUMMARY

(1) Technical Problem to be Addressed

As an attempt to address foregoing issues, the present disclosure provides an antenna, which achieves miniaturization of multi-band antennas and a sufficiently wide bandwidth of VSWR on each frequency band. In addition, a choke structure may be further disposed on the radiator, so as to change a current distribution on the radiator and thus improve the radiation pattern for the high frequency band.

(2) Technical Solution

According to an aspect of the present disclosure, there is provided an antenna, including: a metal tube; a coaxial cable disposed along a central axis of the metal tube; and a variable-impedance transmission wire structure where both a dielectric body and a metal part arranged along an axial direction of the cable are included.

In some embodiments of the present disclosure, the metal tube includes: a first metal tube, a second metal tube and a third metal tube which are arranged along the axial direction of the coaxial cable. A first dielectric body is disposed in the first metal tube. A first metal part is disposed in the first metal tube or between the first metal tube and the second metal tube. A second metal part and/or a second dielectric body are disposed in the second metal tube, and a fourth metal part is disposed in the third metal tube.

In other embodiments of the present disclosure, at least one second dielectric body and at least one second metal part are disposed in the second metal tube, and the second dielectric body and the second metal part are ring-shaped and are arranged along the axial direction of the coaxial cable.

In further embodiments of the present disclosure, an outer surface of the second metal part is connected to an inner surface of the second metal tube, for changing an inner diameter of the second metal tube, wherein the second metal part and the second metal tube are integrally formed.

In yet further embodiments of the present disclosure, the first metal tube and the second metal tube are integrally formed, and/or the first metal part and the second metal part are integrally formed, and/or the second metal tube and the second metal part are integrally formed, and/or the third metal tube and the fourth metal part are integrally formed.

In some embodiments of the present disclosure, the antenna further includes: a first inductor, disposed between the second metal tube and the third metal tube and connected to the second metal tube or the third metal tube; and/or a second inductor, disposed between the first metal tube and the second metal tube and connected to the second metal tube or connected to at least one of the first metal tube and the first metal part.

In other embodiments of the present disclosure, the first metal part is disposed between the first metal tube and the second metal tube or in the first metal tube and connected to a shielding layer of the coaxial table, the first metal tube and the second metal tube.

In further embodiments of the present disclosure, the first inductor and the second inductor are with a helical or meandering structure or with a lumped inductor component.

In yet further embodiments of the present disclosure, one end of an inner conductor of the coaxial cable is connected to the third metal part, and the third metal part is at least partially in the second metal tube. A first capacitor structure is formed of the inner conductor, the third metal part, the second metal tube, at least one second dielectric body and at least one second metal part, and a second capacitor structure is formed of the second metal tube and the third metal tube. The first capacitor structure and the second capacitor structure are for adjusting a capacitance value between an upper radiator and a lower radiator.

In some embodiments of the present disclosure, the coaxial cable extends through the first metal tube and the second inductor, is at least partially in the second metal tube, and has the inner conductor at one end thereof connected to the third metal part, and the third metal part extends through the first inductor and is at least partially in the third metal tube, so as to form an inductive reactance structure.

In other embodiments of the present disclosure, the upper radiator includes the inner conductor, the third metal part, the fourth metal part and the third metal tube, and the lower radiator includes the first metal tube, the first metal part and the second metal tube. A choke structure is disposed on the upper radiator and/or the lower radiator for changing a current distribution on the radiators.

In further embodiments of the present disclosure, a size of the first metal tube along the axial direction of the coaxial cable is $L_1$, and $L_1=0.25\ \lambda_1$, where $\lambda_1$ is a wavelength of a frequency at a low frequency band between a lower limit frequency and a central frequency.

In yet further embodiments of the present disclosure, a size of the second metal tube along the axial direction of the coaxial cable is $L_3$, and $L_3=0.25(\lambda_1-\lambda_2)$, where $\lambda_2$ is a wavelength of a frequency at a low frequency band between a central frequency and an upper limit frequency.

In some embodiments of the present disclosure, the choke structure includes a first choke sleeve and a second choke sleeve, each of which has a length of $L_6$, and $L_6=0.25\ \lambda_6$, where $\lambda_6$ is a wavelength of a central frequency at a high frequency band which needs to be choked.

In some embodiments of the present disclosure, the first metal tube and/or the second choke sleeve is replaced with the ground.

(3) Effects

From the above technical solution, it can be seen that the present disclosure has at least one of the following beneficial effects:
(1) Adopting a variable-impedance transmission line structure in the connection portion of the antenna and the coaxial cable, which makes the resulting structure stable and reliable and have a low loss, which is apt to make the input impedance of the antenna and the impedance of the coaxial cable match with each other, and which is also convenient for practical applications.
(2) Multiple capacitive reactance structures and inductive reactance structures are adopted to adjust the input impedance of the antenna, which will be advantageous for matching the input impedance of the antenna with the impedance of the coaxial cable.
(3) Frequency ranges for primary resonance and secondary resonance may be effectively adjusted to optimize the bandwidth of VSWR by designing sizes of various structures of the antenna, choosing dielectric bodies in different dielectric constants, and choosing different parameters of distributed and/or lumped components.
(4) Current distributions on the upper radiator and the lower radiator of the antenna may be changed by disposing choke structures on the radiators, so as to improve the radiation pattern at the high frequency band.

BRIEF DESCRIPTION OF THE DRAWINGS

The foregoing description and other objectives, features and advantages of the present disclosure will become more apparent from the accompanying drawings. The same reference numerals indicate the same parts throughout the drawings. The drawings are not schematically scaled by actual dimensions, and emphasis is given to the gist of the present disclosure.

MAIN ELEMENTS

Figure 1:
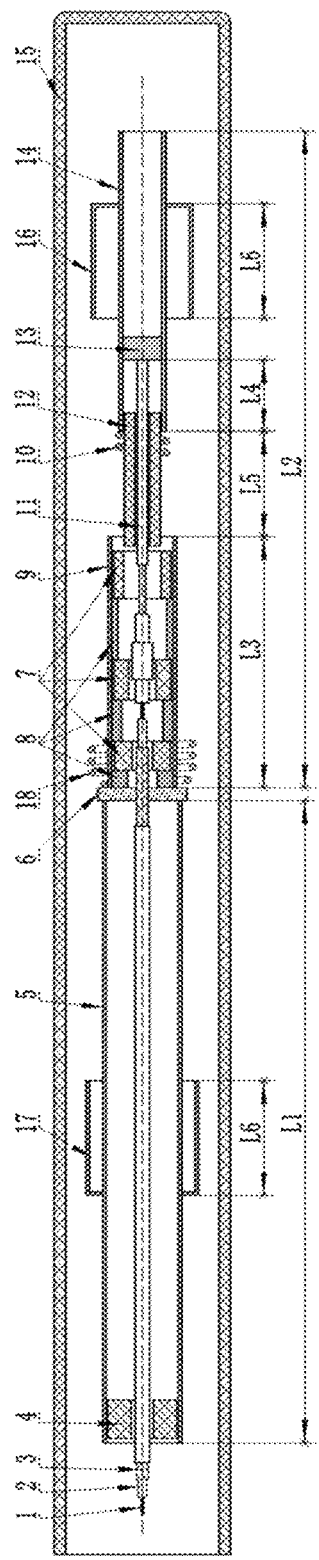
FIG. 1 is a structural diagram of an antenna according to an embodiment of the present disclosure.

1—inner conductor; 2—insulating layer; 3—shielding layer; 4—first dielectric body; 5—first metal tube; 6—first metal part; 7—second dielectric body; 8—second metal part; 9—second metal tube; 10—first inductor; 11—third metal part; 12—third dielectric body; 13—fourth metal part; 14—third metal tube; 15—antenna radome; 16—first choke sleeve; 17—second choke sleeve; 18—second inductor; 19—ground.

THE DESCRIPTION OF EMBODIMENTS

In order to make the objectives, technical solutions and advantages of the present disclosure more clear and apparent from the detailed description set forth below when taken in conjunction with specific embodiments with reference to the accompanying drawings.

Reference is now made to the drawings or description wherein like numerals refer to like parts throughout. The implementations that are not shown or described in the drawings are in a form known to those of ordinary skill in the technical field. In addition, although this disclosure may provide an example of a parameter that contains a particular value, it should be understood that the parameter needs not to be exactly equal to the corresponding value but may be approximated to an appropriate value within an acceptable error tolerance or design constraint. As used herein, the orientation terms, "up", "down", "front", "back", "left", "right" and the like merely connote a relative position or geometry of one component to another, refer generally and without the limitation of the protection scope of the present disclosure.

The present disclosure is based on half wavelength coaxial dipole antennas and synthesizes multiple techniques to achieve the effects of spreading a single frequency band to a multi-band band and broadening the frequency band.

The present disclosure provides an antenna. FIG. 1 shows a structural diagram of the antenna. With reference to FIG. 1, the antenna includes:
a metal tube;
a coaxial cable disposed along a central axis of the metal tube; and a variable-impedance transmission wire structure including a dielectric body and a metal part which are arranged along an axial direction of the coaxial cable.

It should be understood that if an appropriate size is assigned for the antenna structure according to the embodiments of the present disclosure, it will exhibit a fairly wide range at a low frequency band.

Specifically, the metal tube includes: a first metal tube, a second metal tube and a third metal tube arranged along the axial direction of the coaxial cable. A first dielectric body is disposed in the first metal tube, and a first metal part is disposed in the first metal tube or between the first metal tube and the second metal tube for connecting with a shielding layer of the coaxial cable, the first metal tube and the second metal tube. A second metal part and/or a second dielectric body are disposed in the second metal tube. A third dielectric body is disposed between the second metal tube and the third metal tube, and a fourth metal part is disposed in the third metal tube.

Details of the antenna structure according to embodiments of the present disclosure will be further described with respect to FIG. 1. Specifically, the coaxial cable includes an inner conductor 1, an insulating layer 2 and a shielding layer 3. The metal tube may include a first metal tube 5, a second metal tube 9, and a third metal tube 14, which are sequentially arranged along the axial direction of the coaxial cable. The first metal tube 5 and the second metal tube 9 may be integrally formed as one metal tube, or separately formed as two metal tubes.

An inductor may be disposed between the first metal tube 5 and the second metal tube 9, and/or between the second metal tube 9 and the third metal tube 14. Specifically, a first inductor 10 may be disposed between the second metal tube 9 and the third metal tube 14, and a second inductor 18 may be disposed between the first metal tube 5 and the second metal tube 9. The first inductor may be connected to one of the second metal tube 9 and the third metal tube 14, and the second inductor may be connected to one of the first metal tube 5 and the second metal tube 9.

The coaxial cable extends through the first metal tube 5 and the first dielectric body 4 and/or the first metal part 6 may be disposed along the axial direction of the coaxial cable. The shielding layer 3 of the coaxial cable is connected to the first metal part 6. Preferably, the first metal part 6 is disposed between the first metal tube and the second metal tube or in the first metal tube. The second inductor 18 may be connected to the second metal tube or connected to at least one of the first metal tube and the first metal part.

Preferably, a size of the first metal tube 5 along the axial direction of the coaxial cable is $L_1$, and $L_1=0.25\lambda_1$, where $\lambda_1$ is a wavelength of a frequency at the low frequency band between a lower limit frequency and a central frequency. Additionally, length-diameter ratios of the antenna radome 15 and the first metal tube 5 should be taken into account when designing $L_1$.

The coaxial cable is at least partially in the second metal tube 9, and the inner conductor 1 of the coaxial cable may extend through the second metal tube 9 or partially extend into the second metal tube 9. A second dielectric body 7 and/or a second metal part 8 may be disposed in the second metal tube 9.

Further, at least one second dielectric body 7 and at least one second metal part 8 may be disposed in the second metal tube 9, wherein an outer surface of the second metal part 8 is connected to an inner surface of the second metal tube 9, so as to change an inner diameter of the second metal tube, Preferably, the at least one second dielectric body 7 and at least one second metal part 8 may be ring-shaped, and both of them are arranged along the axial direction of the coaxial cable.

In a case the coaxial cable partially extends into the second metal tube 9, a third metal part 11 may be connected to one end of its inner conductor 1, and a front portion of the third metal part 11 extends through the second metal tube 9 and is at least partially in the third metal tube 14 together with the inductor 10, wherein a size of the second metal tube along the axial direction of the coaxial cable is $L_3$, and $L_3=0.25(\lambda_1-\lambda_2)$, where $\lambda_2$ is a wavelength of a frequency at the low frequency band between a central frequency and an upper limit frequency, and the effect of length-diameter ratios of the antenna radome 15 and the second metal tube 9 should be taken into account when calculating $L_3$. A distance from a distal end of the second metal tube to a distal end of the third metal tube is $L_2$, wherein the distal end of the second metal tube is one of its two ends that is farther away from the third metal tube. Accordingly, the distal end of the third metal tube is one of its two ends that is farther away from the second metal tube. With reference to FIG. 1, $L_2$ refers to a distance from the left end of the second metal tube to the right end of the third metal tube. $L_2$ is close to $L_1$, so that a maximum gain direction of the antenna is close to the horizontal direction. Length-diameter ratios of the antenna radome 15, the first metal tube 5, the second metal tube 9 and the third metal tube 14 should be taken into account when calculating $L_1$ and $L_3$.

A fourth metal part 13 may be disposed in the third metal tube 14 and connected thereto. In one embodiment, the fourth metal part 13 and the third metal tube may be integrally formed, where the inner conductor 1 of the coaxial cable is directly connected to the fourth metal part 13 or connected to the fourth metal part 13 via the third metal part 11. Referring to FIG. 1, a distance from a connection portion between the third metal part 11 and the fourth metal part 13 to a left side of the third metal tube is equal to $L_4$.

There is a gap with a size of $L_5$ between the second metal tube 9 and the third metal tube.

An upper radiator of the antenna includes the inner conductor, the third metal part, the fourth metal part, the third metal tube and the first choke sleeve. A lower radiator of the antenna includes the first metal tube, the first metal part, the second metal tube and the second choke sleeve.

The inner conductor 1 at one end of the coaxial cable is connected to the third metal part 11. The third metal part is a diameter-variant column and is at least partially in the second metal tube 9. A first capacitor structure is formed of the inner conductor 1, the third metal part, the second metal tube 9, at least one second dielectric body and at least one second metal part 8. A second capacitor structure is formed of the second metal tube and the third metal tube. The first capacitor structure and the second capacitor structure are respectively for adjusting a capacitance value between the upper radiator and the lower radiator.

The third metal tube 14 or the second metal tube 9 is connected to the first inductor 10 to form a first inductive reactance structure. The first metal tube 5 or the second metal tube 9 is connected to the second inductor 18 to form a second inductive reactance structure. The third metal part extends into the third metal tube to form a third inductive reactance structure.

By appropriately adjusting the following parameters of the antenna structure according to the present disclosure, a fairly wide range of the low frequency band (i.e. a range of primary resonance) and an adjustable band range of secondary resonance may be achieved so as to reduce a reactance part of the characteristic impedance of the antenna and improve matching with the coaxial transmission wire: inner and outer diameters of the first metal tube 5, the second metal tube 9 and the third metal tube 14, inner and outer diameters of respective metal parts, the size $L_1$ of the first metal tube 5 along the axial direction of the coaxial cable, the distance $L_2$ from the distal end of the second metal tube to the distal end of the third metal tube, the size $L_3$ of the second metal tube along the axial direction of the coaxial cable, a number, length, shape (including inner and outer diameters) and dielectric constant of the second dielectric body, a number and shape (including inner and outer diameters) of the second metal part, relative arrangement of the second dielectric body and the second metal part, and values of the first and second inductors.

Additionally, the antenna may further include an antenna radome 15 for providing a space for receiving the antenna. In order to improve the radiation pattern at a high frequency band, one or more notch structures or choke structures may be disposed on the upper and lower radiators of the antenna, so that current distributions for certain frequencies on the radiators may be changed. For example, a first choke sleeve 16 may be disposed on the third metal tube, and/or a second choke sleeve 17 may be disposed on the first metal tube, so that current distributions for certain frequencies on the radiators may be changed. As shown in FIG. 1, an opening direction of the first choke sleeve is towards to the left, and an opening direction of the second choke sleeve is towards to the right. Those skilled in the art should understand that the opening direction of the first choke sleeve may be alternatively towards to the right, and the opening direction of the second choke sleeve may be alternatively towards to the left.

A length of each of the first choke sleeve 16 and the second choke sleeve 17 is $L_6$, and $L_6=0.25 \lambda_6$, where $\lambda_6$ is a wavelength of a central frequency of a frequency band to be choked at the high frequency band.

Additionally, in the embodiment above, the first metal tube and the second metal tube may be integrally formed as one metal tube, or alternatively formed as two connected metal tubes. Similarly, the first metal part and the at least one second metal part may be integrally formed as one metal part, or alternatively formed as multiple separated or connected metal parts. The second metal tube and the at least one second metal part may be integrally formed (which means the second metal tube has a variable inner diameter), or formed as multiple connected parts. The third metal tube and the fourth metal part may be integrally formed, or alternatively formed as two connected parts.

In the embodiment above, the inner conductor at one end of the coaxial cable is connected to the third metal part. Those skilled in the art should understand that, in a case that the outer diameter of the third metal part is close or equal to that of the inner conductor of the coaxial cable, the third metal part and the inner conductor of the coaxial cable may be integrally formed. That is, the third metal part may be a portion of the inner conductor of the coaxial cable.

In the embodiment above, although preferred numbers, shapes and arrangements of the second dielectric body and the second metal part are exemplarily provided, the present disclosure is not limited thereto, and those skilled in the art should understand that the numbers of the second dielectric body and the second metal part may be increased or decreased, and other shapes or arrangements may be adopted.

In the embodiment above, the dielectric body may have a dielectric constant of any value.

In the embodiment above, various components of the coaxial cable, including the inner conductor, the insulating layer and the shielding layer, each has a round or ring-shaped cross section. Alternatively, they can be formed into any other shape.

In the embodiment above, the coaxial cable may be replaced by a planar transmission wire structure, such as a stripe line, a micro-strip line, a co-planar waveguide etc. Planar structures can be used to replace the first, second, and third metal tubes, the first, second, third, and fourth metal parts, and the first and second choke sleeves.

In the embodiment above, the coaxial transmission wire formed of the second metal tube, the second dielectric body, the second metal part, the inner conductor and the third metal part may be changed to a planar transmission wire structure, such as a stripe line, a micro-strip line, a co-planar waveguide etc. Capacitor between the coaxial transmission wires or planar transmission wires may be implemented by lumped capacitors.

In the embodiment above, the first inductor and the second inductor may be with a helical or meandering structure or with a lumped inductor component. The third inductive reactance structure may also be implemented by providing a lumped inductor between the third metal part and the fourth metal part.

Figure 2:
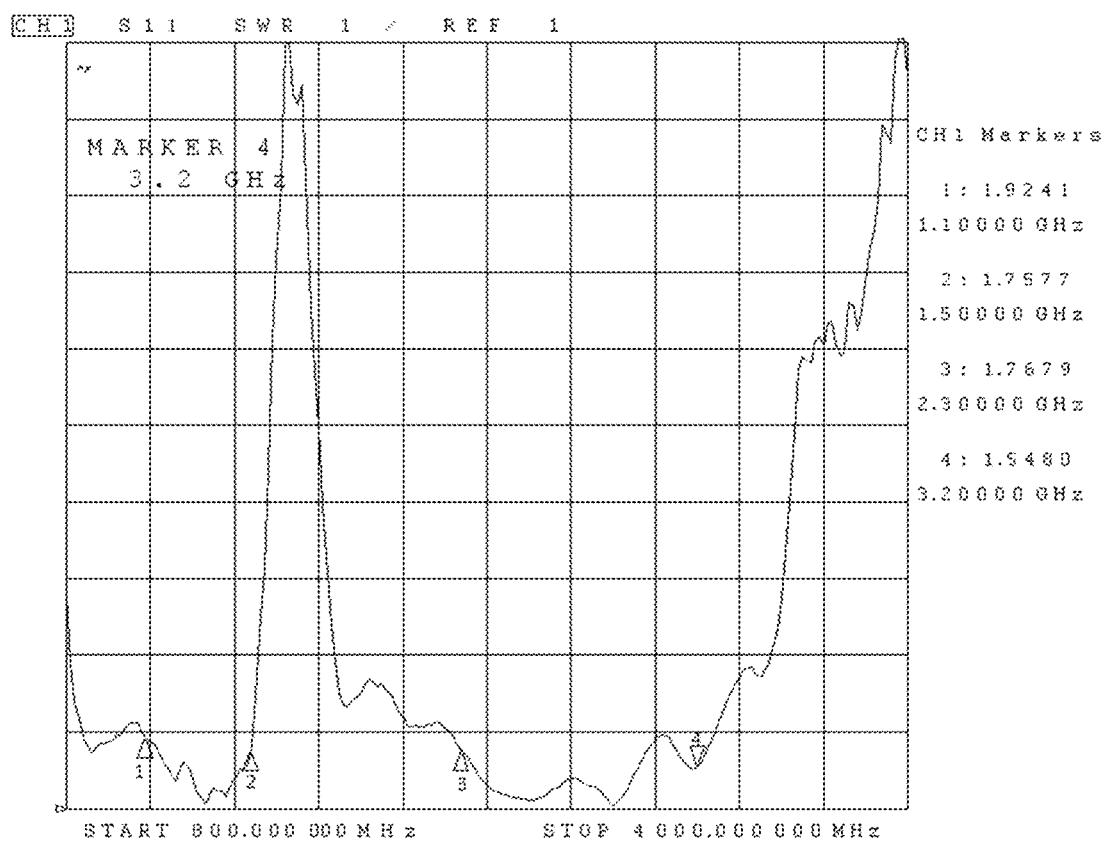
FIG. 2 is a VSWR diagram for an antenna according to an embodiment of the present disclosure.

FIG. 2 is a VSWR diagram for a multi-band antenna according to an embodiment of the present disclosure. As shown in FIG. 2, in frequency ranges of 1.1-1.5 GHz and 2.3-3.2 GHz, the VSWR is less than 2, and thereby the multi-band antenna according to the embodiment of the present disclosure achieves a wider bandwidth.

Figure 3:
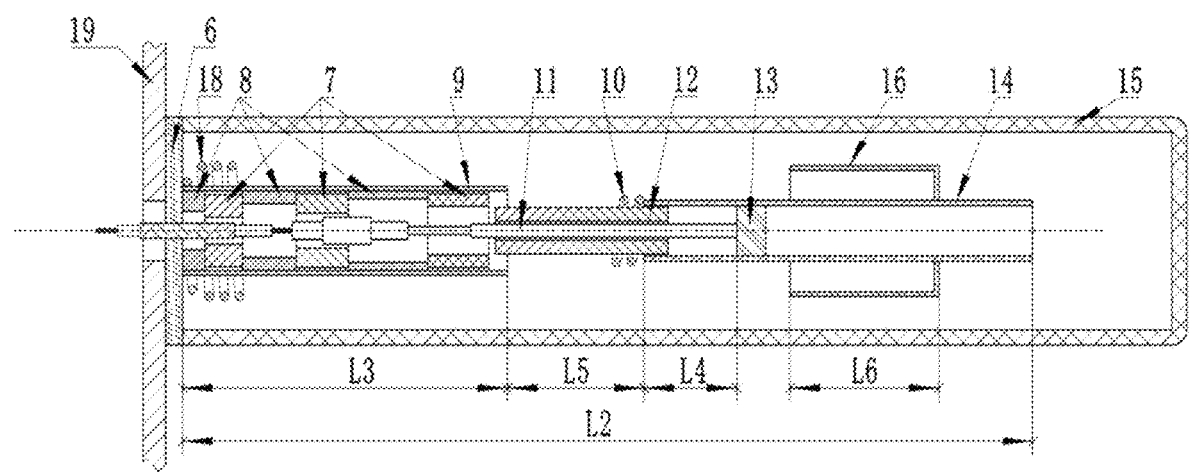
FIG. 3 is a structural diagram of another antenna according to an embodiment of the present disclosure.

In some cases, a volume of the antenna is required to be smaller. In this case, a structure of the antenna may be changed from a coaxial half-wavelength dipole to a ¼ wavelength monopole. As shown in FIG. 3, the first metal tube 5 and the second choke sleeve 17 are replaced with the ground 19, and sizes of these parts are appropriately adjusted. In addition, the first metal tube 5 or the second choke sleeve 17 may be replaced with the ground 19. The ground 19 may be a part of the antenna or the ground 19 is not included in the antenna. In addition to the ground, a ground wire, a metal housing of a communication device or a circuit board may also provide similar functions.

The antenna according to the present disclosure provides the following benefits: miniaturization of a multi-band antenna, a sufficiently wide bandwidth for each frequency band, adjustable band ranges for primary resonance and secondary resonance, a reduced reactance portion of the characteristic impedance of the antenna, improved matching with transmission wires, a better VSWR bandwidth, change of a current distribution on radiators, and an improved radiation pattern for a high frequency band.

It will be recognized by those of ordinary skill in the art that the embodiments above are merely illustrative of the present disclosure and in no way limit the present disclosure. Any modification or variance of the embodiments will fall within the protection scope of disclosure.

The foregoing description of the disclosed embodiments will enable one skilled in the art to make or use the present application. Various modifications to these embodiments will be apparent to those skilled in the art, and the generic principles defined herein may be embodied in other embodiments without departing from the spirit or scope of the present application. Accordingly, this application will not be limited to the embodiments shown herein, but is to be accorded the widest scope consistent with the principles and novel features disclosed herein.

It is to be understood that the means not illustrated or described in the text of the drawings or description are in the form known to those of ordinary skill in the art and are thus not described in detail herein. In addition, the above-described definitions of the elements and methods are not limited to the various specific structures, shapes or modes mentioned in the embodiments, and one of ordinary skill in the art make a simple change or replacement.

The foregoing detailed description of the objectives, technical solutions and advantages of the present disclosure has been made in detail, and it is to be understood that the foregoing is only a specific embodiment of the present disclosure and in no way limit the present disclosure. Any modifications, equivalent substitutions, improvements, and the like within the spirit and principles of the present disclosure are intended to be included within the scope of the present disclosure.

What is claimed is:

1. An antenna, comprising:
    a metal tube;
    a coaxial cable disposed along a central axis of the metal tube; and
    a variable-impedance transmission wire structure comprising a dielectric body and a metal part arranged along an axial direction of the coaxial cable,
    wherein the metal tube comprises:
    a first metal tube, a second metal tube and a third metal tube arranged along the axial direction of the coaxial cable,
    wherein
    a first dielectric body is disposed in the first metal tube,
    a first metal part is disposed in the first metal tube or between the first metal tube and the second metal tube,
    a second metal part or a second dielectric body is disposed in the second metal tube,
    a third metal part is disposed in the second metal tube or the third metal tube,
    and
    a fourth metal part is disposed in the third metal tube.

2. The antenna according to claim 1, wherein at least one second dielectric body and at least one second metal part are disposed in the second metal tube, and the second dielectric body and the second metal part are ring-shaped and are arranged along the axial direction of the coaxial cable.

3. The antenna according to claim 2, wherein one end of an inner conductor of the coaxial cable is connected to the third metal part and the inner conductor is connected to the fourth metal part through the third metal part, or the inner conductor and the third metal part may be integrally formed and are connected to the fourth metal part as a whole,
    the third metal part is at least partially in the second metal tube,
    a first capacitor structure is formed of the inner conductor, the third metal part, the second metal tube, at least one second dielectric body and at least one second metal part, and a second capacitor structure is formed of the second metal tube and the third metal tube, and
    the first capacitor structure and the second capacitor structure are for adjusting a capacitance value between an upper radiator and a lower radiator.

4. The antenna according to claim 3, further comprising:
    a first inductor, disposed between the second metal tube and the third metal tube, and connected to the second metal tube or the third metal tube; or a second inductor, connected to the second metal tube or connected to at least one of the first metal tube and the first metal part,
    wherein the coaxial cable extends through the first metal tube and the second inductor, is at least partially in the second metal tube, and has the inner conductor at one end thereof connected to the third metal part, and the third metal part extends through the first inductor or through both the first inductor and the second inductor and is at least partially in the third metal tube to form an inductive reactance structure.

5. The antenna according to claim 4, wherein the upper radiator comprises the inner conductor, the third metal part, the fourth metal part and the third metal tube, and the lower radiator comprises the first metal tube, the first metal part and the second metal tube, and
    a choke structure is disposed on the upper radiator or the lower radiator or disposed on the upper radiator and the lower radiator for changing a current distribution on the radiators.

6. The antenna according to claim 5, wherein the choke structure comprises a first choke sleeve and a second choke sleeve, each of which has a length of $L_6$, and $L_6=0.25 \lambda_6$, where $\lambda_6$ is a wavelength of a central frequency at a high frequency band which needs to be choked.

7. The antenna according to claim 6, wherein the first metal tube or the second choke sleeve is replaced with the ground or the first metal tube and the second choke sleeve are replaced with the ground.

8. The antenna according to claim 3, wherein the upper radiator comprises the inner conductor, the third metal part, the fourth metal part and the third metal tube, and the lower radiator comprises the first metal tube, the first metal part and the second metal tube, and
    a choke structure is disposed on the upper radiator or the lower radiator or disposed on the upper radiator and the lower radiator for changing a current distribution on the radiators.

9. The antenna according to claim 8, wherein the choke structure comprises a first choke sleeve and a second choke sleeve, each of which has a length of $L_6$, and $L_6=0.25 \lambda_6$, where $\lambda_6$ is a wavelength of a central frequency at a high frequency band which needs to be choked.

10. The antenna according to claim 9, wherein the first metal tube or the second choke sleeve is replaced with the ground or the first metal tube and the second chocke sleeve are replaced with the ground.

11. The antenna according to claim 1, wherein an outer surface of the second metal part is connected to an inner surface of the second metal tube, so as to change an inner diameter of the second metal tube, wherein the second metal part and the second metal tube are integrally formed.

12. The antenna according to claim 1, wherein the first metal tube and the second metal tube are integrally formed, or the first metal part and the second metal part are integrally formed, or the second metal tube and the second metal part are integrally formed, or the third metal tube and the fourth metal part are integrally formed.

13. The antenna according to claim 1, further comprising:
    a first inductor, disposed between the second metal tube and the third metal tube, and connected to the second metal tube or the third metal tube; or
    a second inductor, connected to the second metal tube or connected to at least one of the first metal tube and the first metal part.

14. The antenna according to claim 13, wherein the first metal part is disposed between the first metal tube and the second metal tube or in the first metal tube, and connected to a shielding layer of the coaxial cable, the first metal tube and the second metal tube.

15. The antenna according to claim 13, wherein the first inductor and the second inductor are with a helical or meandering structure or with a lumped inductor component.

16. The antenna according to claim 1, wherein a size of the first metal tube along the axial direction of the coaxial cable is $L_1$, and $L_1=0.25\ \lambda_1$, where $\lambda_1$ is a wavelength of a frequency at a low frequency band between a lower limit frequency and a central frequency.

17. The antenna according to claim 1, wherein a size of the second metal tube along the axial direction of the coaxial cable is $L_3$, and $L_3=0.25(\lambda_1-\lambda_2)$, where $\lambda_1$ is a wavelength of a frequency at a low frequency band between a lower limit frequency and a central frequency, and $\lambda_2$ is a wavelength of a frequency at the low frequency band between the central frequency and an upper limit frequency.

18. The antenna according to claim 1, wherein the second metal part and the second dielectric body is disposed in the second metal tube.

19. The antenna according to claim 1, wherein the third metal part is disposed in the second metal tube and the third metal tube.

* * * * *